United States Patent
Murayama et al.

(10) Patent No.: US 7,440,307 B2
(45) Date of Patent: Oct. 21, 2008

(54) MEMORY

(75) Inventors: Yoshiki Murayama, Gifu (JP);
Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 211 days.

(21) Appl. No.: 11/584,491

(22) Filed: Oct. 23, 2006

(65) Prior Publication Data

US 2007/0121365 A1    May 31, 2007

(30) Foreign Application Priority Data

Oct. 27, 2005    (JP) .............................. 2005-313317

(51) Int. Cl.
*G11C 11/22* (2006.01)
(52) U.S. Cl. ...................................... 365/145; 365/149
(58) Field of Classification Search ................. 365/145, 365/149
See application file for complete search history.

(56) References Cited

U.S. PATENT DOCUMENTS 5,495,438 A    2/1996    Omura
5,668,754 A *  9/1997    Yamashita ................... 365/145
6,046,929 A *  4/2000    Aoki et al. ................... 365/145
6,094,369 A *  7/2000    Ozawa et al. ................ 365/145
6,188,600 B1 * 2/2001    Ishiwara ..................... 365/145
6,288,931 B1 * 9/2001    Kye et al. .................... 365/145

FOREIGN PATENT DOCUMENTS

JP    7-122661 A    5/1995

* cited by examiner

*Primary Examiner*—Anh Phung
(74) *Attorney, Agent, or Firm*—McDermott Will & Emery LLP

(57) ABSTRACT

This memory comprises a bit line, a first word line and a second word line arranged to intersect with the bit line while holding the bit line therebetween and a first ferroelectric film and a second ferroelectric film, having capacitances different from each other, arranged between the bit line and the first word line and between the bit line and the second word line respectively at least on a region where the bit line and the first and second word lines intersect with each other. The bit line, the first word line and the first ferroelectric film constitute a first ferroelectric capacitor while the bit line, the second word line and the second ferroelectric film constitute a second ferroelectric capacitor, and the first ferroelectric capacitor and the second ferroelectric capacitor constitute a memory cell.

17 Claims, 11 Drawing Sheets

PERIOD T2

PERIOD T2

PERIOD T3

PERIOD T3

PERIOD T4

PERIOD T4

MEMORY

BACKGROUND OF THE INVENTION

1. Field of the Invention

The present invention relates to a memory, and more particularly, it relates to a memory comprising a memory cell including ferroelectric capacitors.

2. Description of the Background Art

A memory (ferroelectric memory) comprising memory cells including ferroelectric capacitors constituted of ferroelectric films formed between electrodes opposed to each other is known in general, as disclosed in Japanese Patent Laying-Open No. 7-122661 (1995), for example. The aforementioned Japanese Patent Laying-Open No. 7-122661 discloses a multi-valued ferroelectric memory comprising memory cells each constituted of a plurality of ferroelectric capacitors having capacitances different from each other. In the ferroelectric memory according to Japanese Patent Laying-Open No. 7-122661, the plurality of ferroelectric capacitors included in each memory cell are arranged to be adjacent to each other in a direction parallel to the surfaces of electrodes.

In the ferroelectric memory according to the aforementioned Japanese Patent Laying-Open No. 7-122661, however, the plane area of each memory cell is disadvantageously increased due to the plurality of ferroelectric capacitors arranged to be adjacent to each other in the direction parallel to the surfaces of the electrodes. Therefore, the size of the multi-valued ferroelectric memory including the memory cells each consisting of the plurality of ferroelectric capacitors having the capacitances different from each other is disadvantageously increased due to the increased plane areas of the memory cells.

SUMMARY OF THE INVENTION

The present invention has been proposed in order to solve the aforementioned problem, and an object of the present invention is to provide a multi-valued memory miniaturizable by reducing the plane area of a memory cell consisting of a plurality of ferroelectric capacitors.

In order to attain the aforementioned object, a memory according to an aspect of the present invention comprises a bit line, a first word line and a second word line arranged to intersect with the bit line while holding the bit line therebetween and a first ferroelectric film and a second ferroelectric film, having capacitances different from each other, arranged between the bit line and the first word line and between the bit line and the second word line respectively at least on a region where the bit line and the first and second word lines intersect with each other. The bit line, the first word line and the first ferroelectric film constitute a first ferroelectric capacitor while the bit line, the second word line and the second ferroelectric film constitute a second ferroelectric capacitor, and the first ferroelectric capacitor and the second ferroelectric capacitor constitute a memory cell.

In the memory according to this aspect, as hereinabove described, the bit line, the first word line and the first ferroelectric film constitute the first ferroelectric capacitor while the bit line, the second word line and the second ferroelectric film constitute the second ferroelectric capacitor and the first and second ferroelectric films have the capacitances different from each other, whereby the hystereses of the first and second ferroelectric capacitors can be rendered different from each other. When the first and second ferroelectric capacitors constitute the memory cell, therefore, the different hystereses of the first and second ferroelectric capacitors are so composited with each other that the hysteresis of the memory cell has a plurality of portions where hysteretic inclination remarkably changes. Therefore, a multi-valued memory can be obtained when the first and second ferroelectric capacitors having different capacitances constitute the memory cell.

In this case, the first and second word lines are arranged to intersect with the bit line while holding the bit line therebetween and the first and second ferroelectric capacitors having the capacitances different from each other are provided between the bit line and the first and second word lines respectively on the region where the bit line and the first and second word lines intersect with each other so that the memory cell has such a structure that the first and second ferroelectric capacitors having the hystereses different from each other are stacked with each other perpendicularly to the surface of the bit line. Thus, the plane area of the memory cell can be reduced as compared with a memory cell formed by first and second ferroelectric capacitors, having hystereses different from each other, arranged in a direction parallel to the surface of a bit line. Consequently, the multi-valued memory can be miniaturized.

In the memory according to the aforementioned aspect, the first ferroelectric film of the first ferroelectric capacitor and the second ferroelectric film of the second ferroelectric capacitor preferably have thicknesses different from each other. According to this structure, the capacitances of the first and second ferroelectric films can be easily rendered different from each other. Thus, the hystereses of the first and second ferroelectric capacitors can also be easily rendered different from each other.

In this case, the first ferroelectric film and the second ferroelectric film are preferably made of the same ferroelectric material, and the ratio $d2/d1$ of the thickness $d2$ of the second ferroelectric film to the thickness $d1$ of the first ferroelectric film is preferably so set as to satisfy the following expression (1):

$$4/3 < d2/d1 < 7/3 \qquad (1)$$

Assuming that Vr represents a voltage applied to a selected word line in a read operation, Va represents a voltage, applied to the selected word line in a rewrite operation, smaller than Vr and larger than 0 V, V1 represents the coercive voltage of the first ferroelectric capacitor including the first ferroelectric film and V2 represents the coercive voltage of the second ferroelectric capacitor including the second ferroelectric film in the read and rewrite operations of the memory, the ratio V2/V1 of the coercive voltage V2 of the second ferroelectric capacitor to the coercive voltage V1 of the first ferroelectric capacitor can be approximated to the ratio Vr/Va of the voltage Vr to the voltage Va according to the aforementioned structure. Thus, the voltages Va and Vr correspond to the thicknesses d1 and d2 of the first and second ferroelectric films respectively. In this case, the memory cell can be prevented from deterioration of a polarization state in the rewrite operation by setting the voltages Va (d1) and Vr (d2) to satisfy the above expression (1).

In the aforementioned structure having the ratio d2/d1 of the thickness d2 of the second ferroelectric film to the thickness d1 of the first ferroelectric film satisfying the expression (1), the memory preferably further comprises a voltage generation circuit generating voltages applied to the memory cell in a read operation and a plurality of rewrite operations on the memory cell, and the voltage generation circuit applies eight types of voltages. According to this structure, the memory can easily perform a data read operation and a plurality of rewrite operations on the memory cell by applying the eight types of voltages when the memory cell is capable of storing four data.

In the aforementioned structure having the ratio d2/d1 of the thickness d2 of the second ferroelectric film to the thickness d1 of the first ferroelectric film satisfying the expression (1), the ratio d2/d1 of the thickness d2 of the second ferroelectric film to the thickness d1 of the first ferroelectric film is preferably substantially 2. According to this structure, the aforementioned voltage Va reaches 1/2Vr so that the number of applied voltages used in the read and rewrite operations of the memory can be reduced, whereby the structure of the voltage generation circuit for generating the applied voltages can be simplified. In this case, the memory may further comprise a voltage generation circuit generating voltages applied to the memory cell in a read operation and a plurality of rewrite operations on the memory cell, and the voltage generation circuit may apply six types of voltages.

The memory according to the aforementioned aspect preferably applies a first voltage and a second voltage of reversed polarity to the first voltage to a nonselected memory cell by the same frequencies respectively in at least one rewrite operation among a read operation and a plurality of rewrite operations on a selected memory cell. According to this structure, the polarization state of the nonselected memory cell is deteriorated and improved by the same frequencies respectively throughout the read and rewrite operations, whereby the memory can prevent the nonselected memory cell from deterioration of the polarization state.

In this case, the read operation and the plurality of rewrite operations on the selected memory cell preferably include a single read and rewrite operation period and three rewrite operation periods, a polarization state of the nonselected memory cell preferably remains unchanging in the single read and rewrite operation period, and the memory preferably applies the first voltage and the second voltage of reversed polarity to the first voltage to the nonselected memory cell by the same frequencies respectively in the three rewrite operation periods. According to this structure, the memory can easily prevent the nonselected memory cell from deterioration of the polarization state throughout the read and rewrite operations.

In the memory according to the aforementioned aspect, the first ferroelectric capacitor and the second ferroelectric capacitor may be connected in parallel with each other.

In the memory according to the aforementioned aspect, the first ferroelectric capacitor and the second ferroelectric capacitor preferably have hystereses different from each other. According to this structure, the hysteresis of the memory cell consisting of the first and second ferroelectric capacitors can easily have a plurality of portions where hysteretic inclination remarkably changes.

In this case, the memory cell may have a composite hysteresis obtained by compositing the hystereses of the first ferroelectric capacitor and the second ferroelectric capacitor with each other. In this case, further, the composite hysteresis preferably has a portion where hysteretic inclination remarkably changes. In this case, in addition, the hysteretic inclination may remarkably change on two portions.

In the aforementioned structure having the hysteresis remarkably changing on two portions, the memory cell preferably has four polarization states when a voltage applied to the memory cell is 0 V. According to this structure, the memory cell can store four data in correspondence to the four polarization states. In this case, one memory cell may be capable of storing four data.

In the memory according to the aforementioned aspect, the first word line is preferably arranged under the bit line through the first ferroelectric film, and the second word line is preferably arranged on the bit line through the second ferroelectric film. According to this structure, the memory cell can be formed in a structure obtained by vertically stacking the first and second ferroelectric capacitors with each other, whereby the plane area of the memory cell can be easily reduced.

In the memory according to the aforementioned aspect, the first ferroelectric film and the second ferroelectric film are preferably so formed as to extend in the same directions as the first word line and the second word line respectively. According to this structure, the first and second ferroelectric films can be employed in common to a plurality of memory cells linked to the first and second word lines respectively, whereby the structure of the memory can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

FIRST EMBODIMENT

The structure of a ferroelectric memory according to a first embodiment of the present invention is described with reference to FIGS. 1 to 8.

Figure 1:
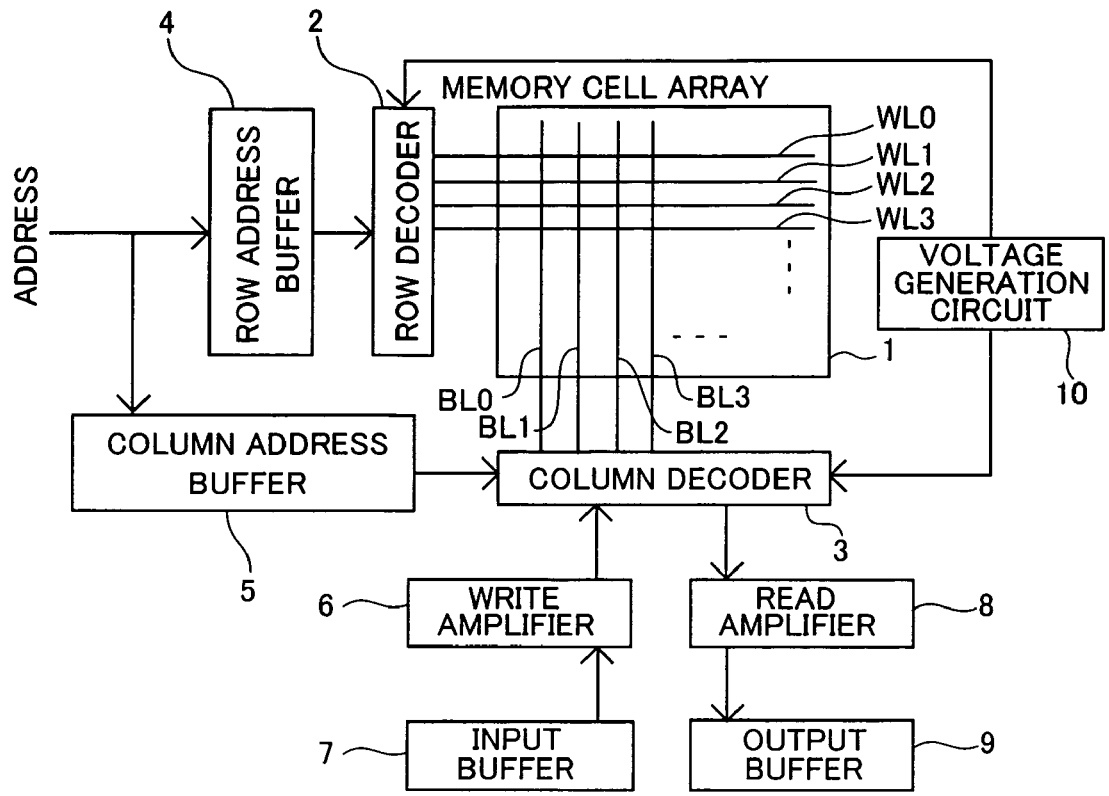
FIG. 1 illustrates the overall structure of a ferroelectric memory according to a first embodiment of the present invention.

As shown in FIG. 1, the ferroelectric memory according to the first embodiment comprises a memory cell array 1, a row decoder 2, a column decoder 3, a row address buffer 4, a column address buffer 5, a write amplifier 6, an input buffer 7, a read amplifier 8 formed by a voltage sense amplifier, an output buffer 9 and a voltage generation circuit 10.

The memory cell array 1 includes a plurality of word lines WL0, WL1, WL2 and WL3 and a plurality of bit lines BL0, BL1, BL2 and BL3 arranged to intersect with the word lines WL0 to WL3 respectively. While FIG. 1 shows only for word lines WL0 to WL3 and only four bit lines BL0 to BL0 in order to simplify the illustration, at least five word lines and at least five bit lines are arranged to intersect with each other in the memory cell array 1 in practice. The plurality of word lines WL0 to WL3 are connected to the row decoder 2, while the plurality of bit lines BL0 to BL3 are connected to the column decoder 3. The row decoder 2 is connected to the row address buffer 4, while the column decoder 3 is connected to the column address buffer 5. The write amplifier 6 and the read amplifier 8 are connected to the column decoder 3. The input buffer 7 and the output buffer 9 are connected to the write amplifier 6 and the read amplifier 8 respectively. The voltage generation circuit 10 is connected to the row decoder 2 and the column decoder 3.

Figure 2:
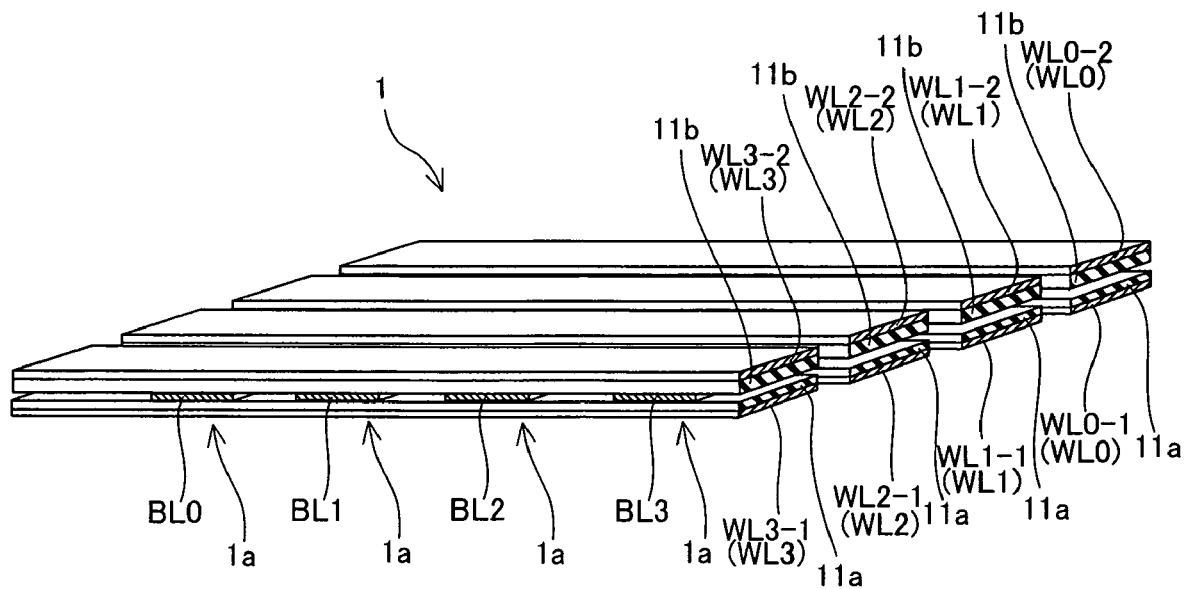
FIG. 2 is a perspective view of each memory cell array of the ferroelectric memory according to the first embodiment shown in FIG. 1.

According to the first embodiment, the word line WL0 is constituted of a pair of word lines WL0-1 and WL0-2 arranged to hold the bit lines BL0 to BL3 therebetween, as shown in FIG. 2. The word lines WL1 to WL3 are also constituted similarly to the aforementioned word line WL0. In other words, the word line WL1 is constituted of a pair of word lines WL1-1 and WL1-2 arranged to hold the bit lines BL0 to BL3 therebetween. The word line WL2 is constituted of a pair of word lines WL2-1 and WL2-2 arranged to hold the bit lines BL0 to BL3 therebetween. The word line WL3 is constituted of a pair of word lines WL3-1 to WL3-2 arranged to hold the bit lines BL0 to BL3 therebetween. According to the first embodiment, the ferroelectric memory applies the same voltage to the pair of word lines WL0-1 (WL1-1, WL2-1, WL3-1) and WL0-2 (WL1-2, WL2-2, WL3-2). The word lines WL0-1, WL1-1, WL2-1 and WL3-1 are examples of the "first word line" in the present invention, and the word lines WL0-2, WL1-2, WL2-2 and WL3-2 are examples of the "second word line" in the present invention.

According to the first embodiment, a ferroelectric film 11a of PZT ($Pb(Zr,Ti)O_3$) having a thickness of several 10 nm to several 100 nm is formed on a surface of the word line WL0-1 (WL1-1, WL2-1, WL3-1) closer to the bit lines BL0 to BL3. Another ferroelectric film 11b of PZT having a thickness of several 10 nm to several 100 nm is formed on a surface of the word line WL0-2 (WL1-2, WL2-2, WL3-2) closer to the bit lines BL0 to BL3. In other words, the ferroelectric film 11a is arranged between the word line WL0-1 (WL1-1, WL2-1, WL3-1) and the bit lines BL0 to BL3 while the ferroelectric film 11b is arranged between the word line WL0-2 (WL1-2, WL2-2, WL3-2) and the bit lines BL0 to BL3. The ferroelectric films 11a and 11b are examples of the "first ferroelectric film" and the "second ferroelectric film" in the present invention respectively.

Figure 3:
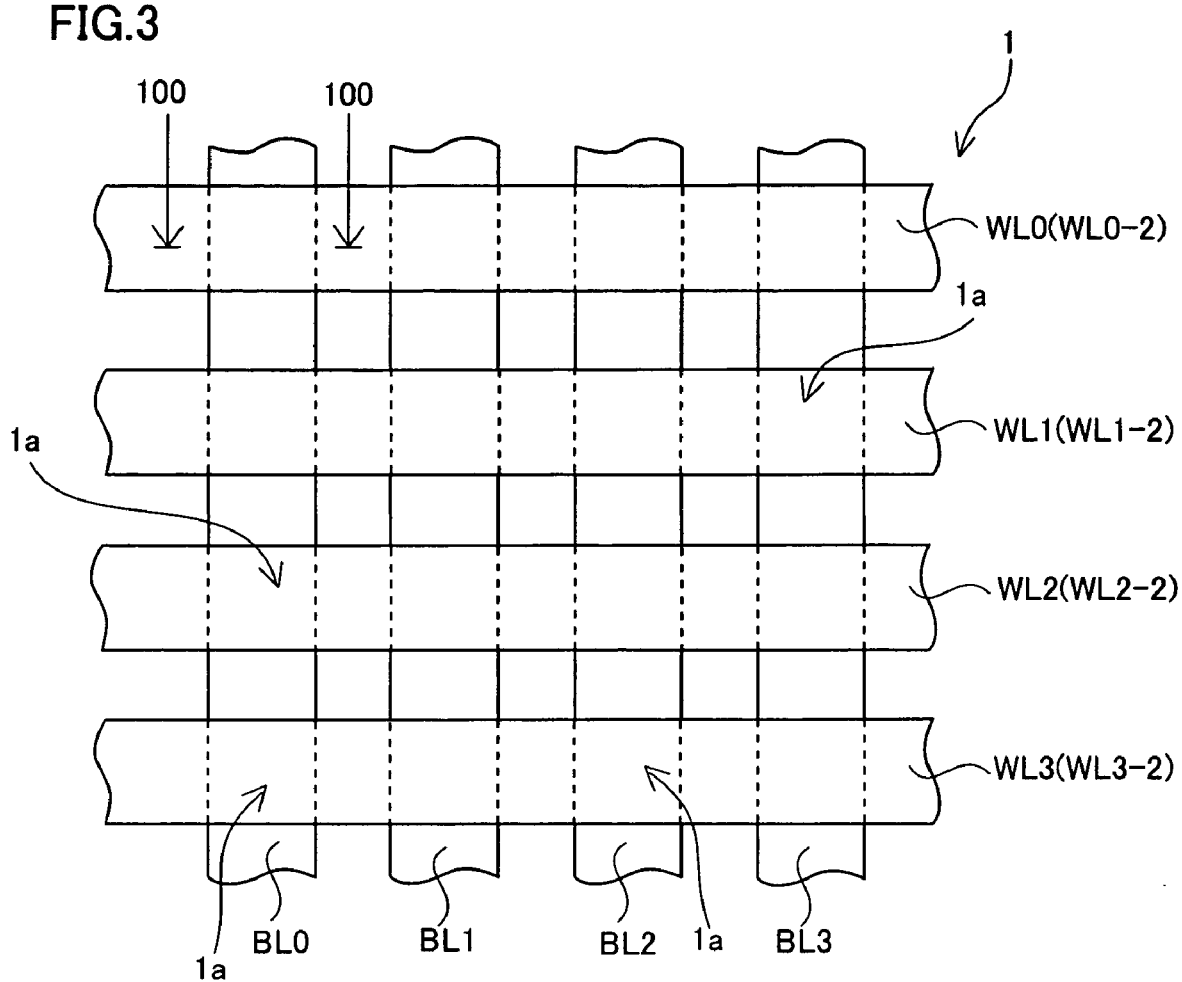
FIG. 3 is a plan view of the memory cell array of the ferroelectric memory according to the first embodiment shown in FIG. 1.

According to the first embodiment, a memory cell 1a including both of the aforementioned ferroelectric films 11a and 11b is arranged on each of regions where the word lines WL0 to WL3 and the bit lines BL0 to BL3 intersect with each other, as shown in FIGS. 2 and 3. More specifically, the word line WL0-1, the bit line BL0 and the ferroelectric film 11a constitute a first ferroelectric capacitor 12a while the word line WL0-2, the bit line BL0 and the ferroelectric film 11b constitute a second ferroelectric capacitor 12b on the region where the word line-WL0 and the bit line BL0 intersect with each other. Also on each of the regions where the word lines WL1 to WL3 and the bit lines BL1 to BL3 intersect with each other, the corresponding word line, the corresponding bit line and the corresponding ferroelectric film 11a constitute a first ferroelectric capacitor 12a while the corresponding word line, the corresponding bit line and the corresponding ferroelectric film 11b constitute a second ferroelectric capacitor 12b. Each memory cell 1a located on each intersection is constituted of the first and second ferroelectric capacitors 12a and 12b. The ferroelectric capacitors 12a and 12b are examples of the "first ferroelectric capacitor" and the "second ferroelectric capacitor" in the present invention respectively.

Figure 5:
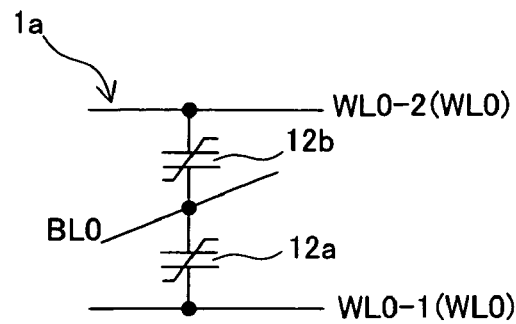
FIG. 5 is a circuit diagram of the memory cell of the ferroelectric memory according to the first embodiment shown in FIG. 1.
Figure 6:
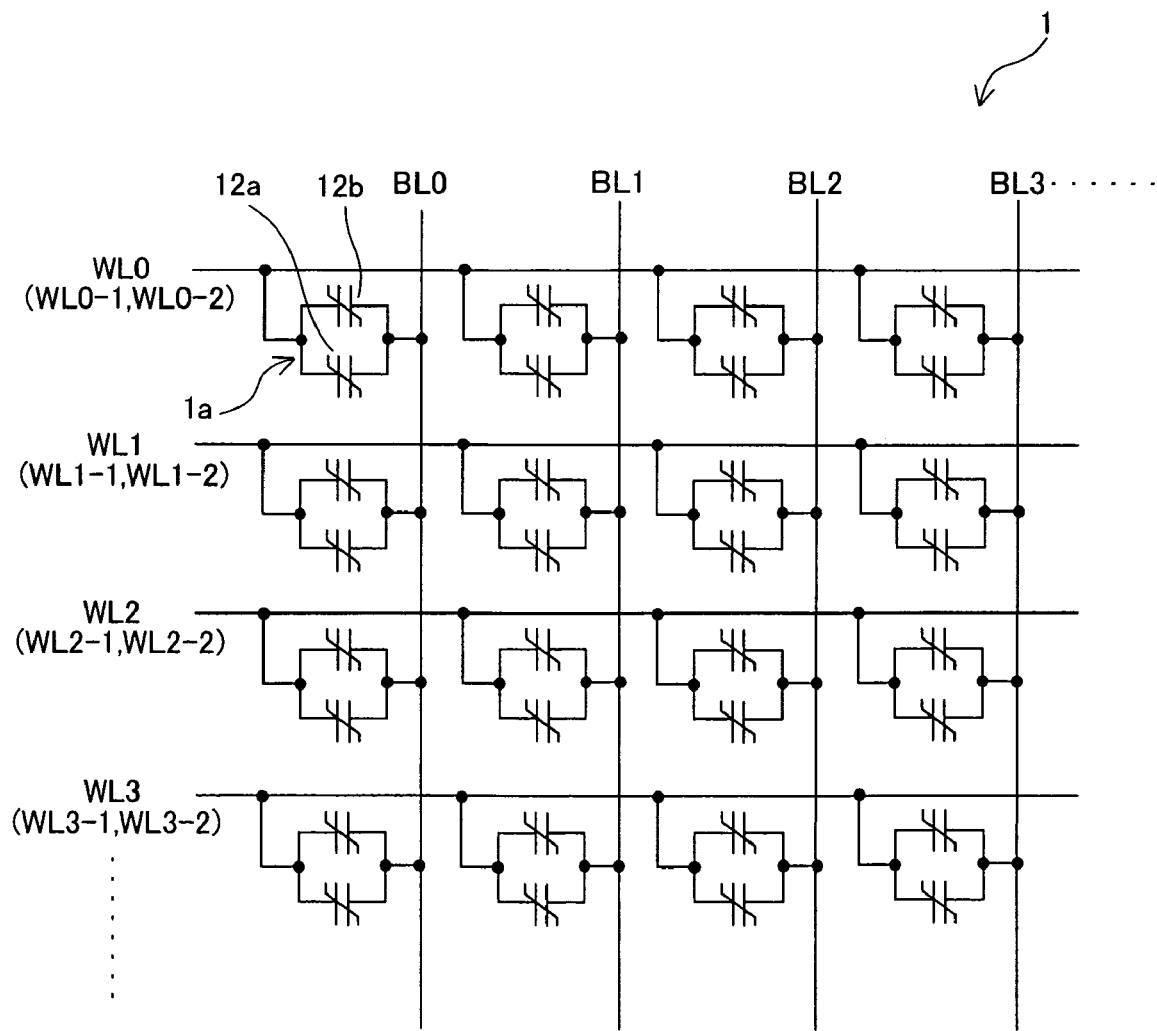
FIG. 6 is a circuit diagram of the memory cell array of the ferroelectric memory according to the first embodiment shown in FIG. 1.

FIG. 5 is a circuit diagram showing the circuit structure of each memory cell 1a constituted of the first and second ferroelectric capacitors 12a and 12b. According to the first embodiment, the ferroelectric memory applies the same voltage to the pair of word lines WL0-1 (WL1-1, WL2-1, WL3-1) and WL0-2 (WL1-2, WL2-2, WL3-2), whereby it follows that the ferroelectric capacitors 12a and 12b are connected in parallel with each other. In other words, each memory cell 1a constituted of the ferroelectric capacitors 12a and 12b connected in parallel with each other is arranged on each of the regions where the plurality of word lines WL0 to WL3 and the plurality of bit lines BL0 to BL3 intersect with each other in the memory cell array 1, as shown in FIG. 6.

Figure 4:
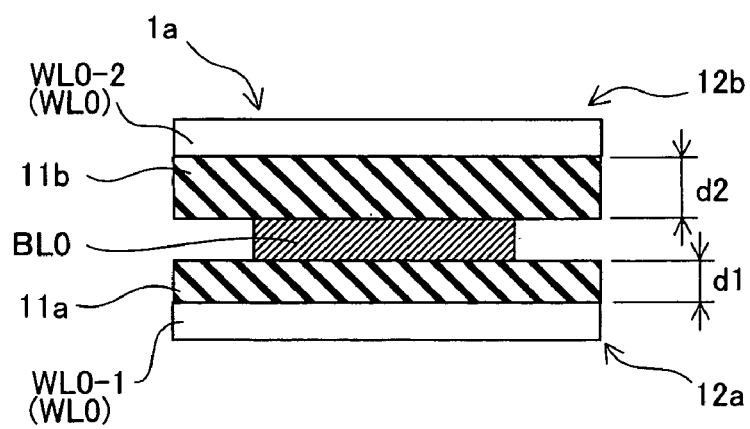
FIG. 4 is a sectional view taken along the line 100-100 in FIG. 3.

According to the first embodiment, the ferroelectric films 11a and 11b included in each memory cell 1a have thicknesses different from each other, as shown in FIG. 4. Assuming that d1 and d2 represent the thicknesses of the ferroelectric films 11a and 11b respectively, the ratio d2/d1 of the thickness d2 of the ferroelectric film 11b to the thickness d1 of the ferroelectric film 11a is set to satisfy the following expression (1):

$$4/3 < d2/d1 < 7/3 \qquad (1)$$

Figure 7:
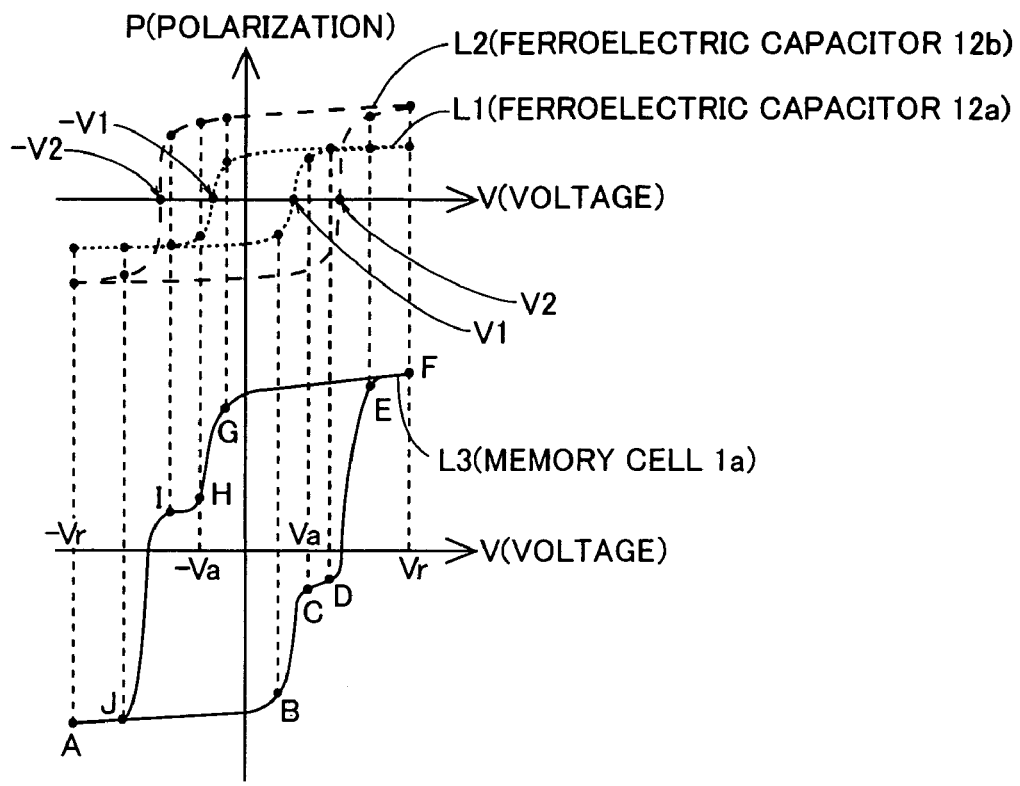
FIGS. 7 and 8 are hysteresis diagrams of the memory cell of the ferroelectric memory according to the first embodiment shown in FIG. 1.

According to the first embodiment, the thicknesses d1 and d2 of the ferroelectric films 11a and 11b are rendered different from each other, whereby the ferroelectric capacitors 12a and 12b including the ferroelectric films 11a and 11b respectively exhibit capacitances different from each other. In other words, the ferroelectric capacitors 12a and 12b have hystereses different from each other, as shown in FIG. 7. According to the first embodiment, therefore, each memory cell 1a has a composite hysteresis obtained by compositing the hystereses of the ferroelectric capacitors 12a and 12b with each other. Referring to FIG. 7, symbols L1 and L2 denote the hystereses of the ferroelectric capacitors 12a and 12b respectively. Further, symbol L3 denotes the composite hysteresis of the memory cell 1a.

Figure 8:
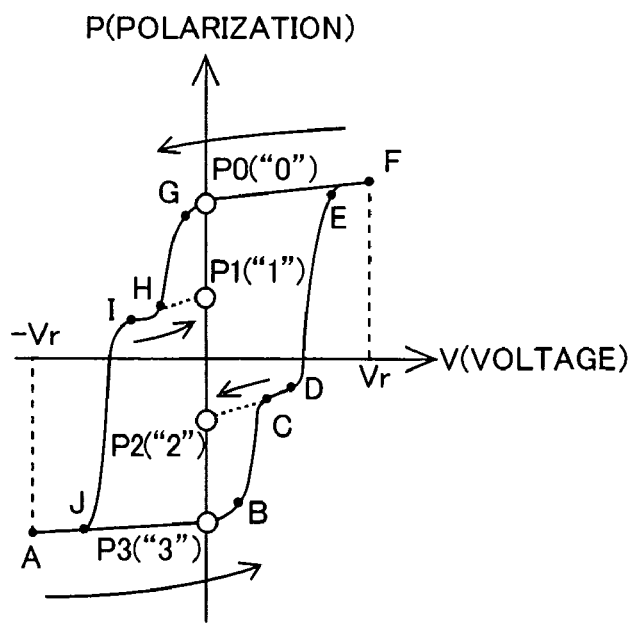

The composite hysteresis of the memory cell 1a has portions (points C and D between points B and E and points H and I between points G to J) where hysteretic inclination remarkably changes when a voltage applied to the memory cell 1a changes from a level (−Vr) corresponding to a point A in FIG. 8 to a level (Vr) corresponding to a point F. A point P3 in FIG. 8 shows the quantity of polarization exhibited when the voltage applied to the memory cell 1a is 0 V in a polarization state between the points A and B where the hysteretic inclination does not much change. Further, a point P0 in FIG. 8 shows the quantity of polarization exhibited when the voltage applied to the memory cell 1a is 0 V in a polarization state between the points F and G where the hysteretic inclination does not much change. On the other hand, a point P2 in FIG. 8 shows the quantity of polarization exhibited when the voltage applied to the memory cell 1a is 0 V in a polarization state between the points C and D where the hysteretic inclination remarkably changes with respect to the states between the points B and C and between the points D and E. Further, a point P1 in FIG. 8 shows the quantity of polarization exhibited when the voltage applied to the memory cell 1a is 0 V in a polarization state between the points H and I where the hysteretic inclination remarkably changes with respect to the states between the points G and H and between the points I and J.

Thus, each memory cell 1a of the ferroelectric memory according to the first embodiment has the aforementioned four polarization states when the voltage applied thereto is 0 V. In other words, the memory cell 1a can hold quaternary data "0", "1", "2" and "3" by making the quantities of polarization (points P0, P1, P2 and P3) in the four polarization states correspond to the quaternary data "0", "1", "2" and "3" respectively.

Assuming that Va (−Va) represents the voltage corresponding to the point C (point H) and V1 and V2 represent the coercive voltages of the ferroelectric capacitors 12a and 12b respectively, the ratio V2/V1 of the coercive voltage V2 of the ferroelectric capacitor 12b to the coercive voltage V1 of the ferroelectric capacitor 12a can be approximated to the ratio Vr/Va of the voltage Vr to the voltage Va according to the first embodiment, as shown in FIG. 7. Thus, the voltages Va and Vr correspond to the thicknesses d1 and d2 (see FIG. 4) of the ferroelectric films 11a and 11b respectively.

Read and rewrite operations of the ferroelectric memory according to the first embodiment are now described with reference to FIGS. 1 and 9 to 17.

Figure 9:
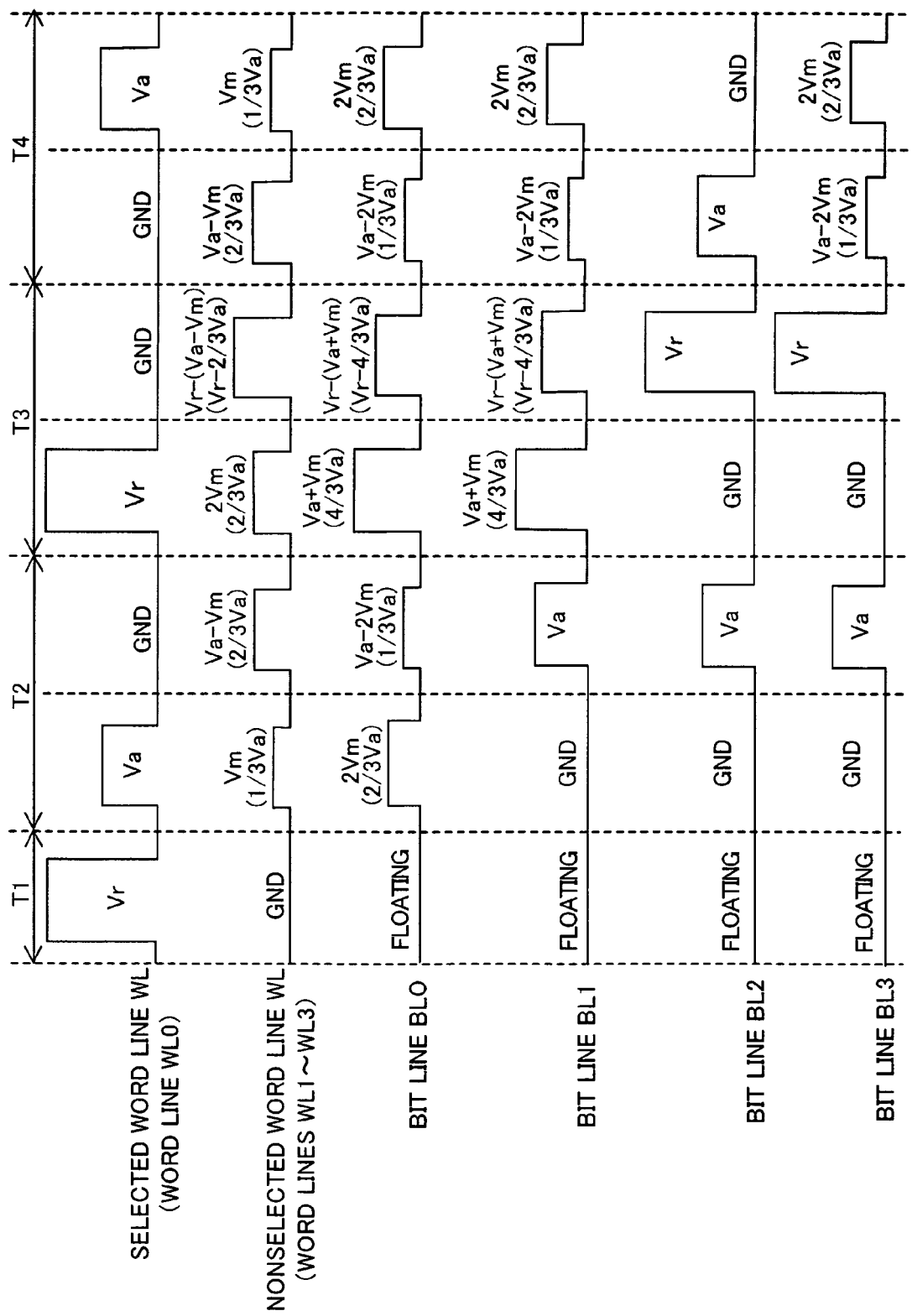
FIG. 9 is a voltage waveform diagram for illustrating read and rewrite operations of the ferroelectric memory according to the first embodiment of the present invention.

The ferroelectric memory according to the first embodiment performs the read and rewrite operations in periods T1, T2, T3 and T4, as shown in FIG. 9. The ferroelectric memory reads and rewrites data "0" in the period T1, and rewrites data "1" in the period T2. Further, the ferroelectric memory rewrites data "3" in the period T3, and rewrites data "2" in the period T4. Operations in the periods T1, T2, T3 and T4 are now more specifically described.

It is assumed that the ferroelectric memory selects the word line WL0 (hereinafter referred to as a selected word line WL) without selecting the word lines WL1 to WL3 (hereinafter referred to as nonselected word lines WL) in the read and rewrite operations according to the first embodiment. It is also assumed that, among the memory cells 1a (hereinafter referred to as selected memory cells 1a) connected to the selected word line WL, the selected memory cell 1a connected to the bit line BL0 stores data "0" while the selected memory cell 1a connected to the bit line BL1 stores data "1". Further, it is assumed that the selected memory cell 1a connected to the bit line BL2 stores data "2" while the selected memory cell 1a connected to the bit line BL3 stores data "3". In addition, it is assumed that the memory cells 1a (hereinafter referred to as nonselected memory cells 1a) connected to the nonselected word lines WL store arbitrary ones of data "0" to "3" respectively.

(Period T1: Read Operation and Rewrite Operation for Data "0")

Figure 10:
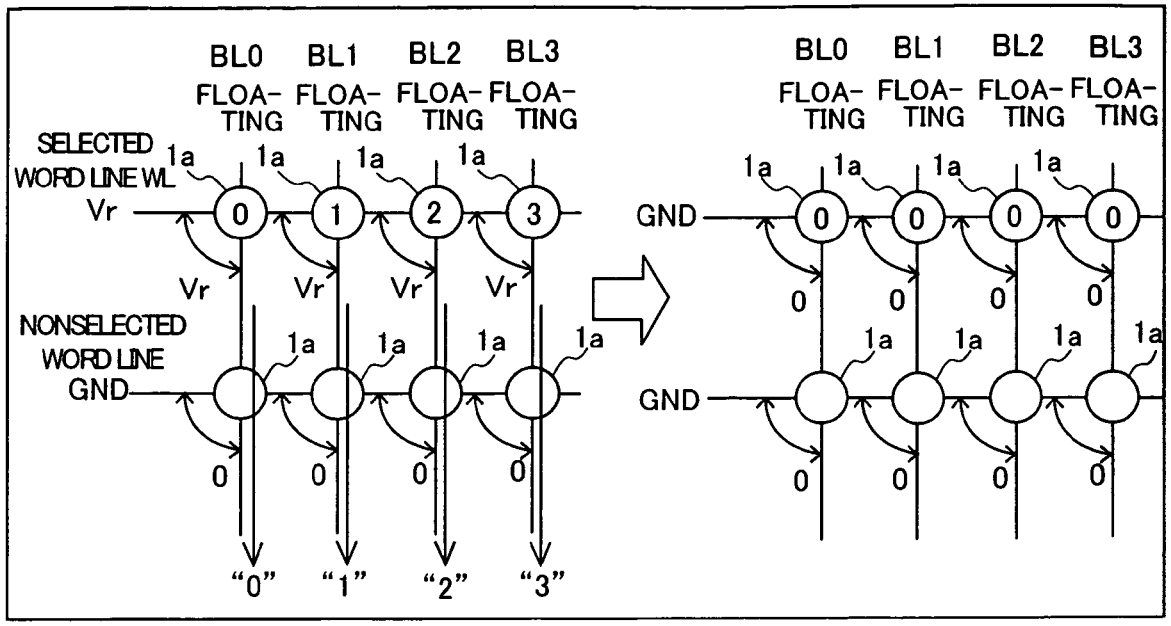
FIG. 10 is a voltage arrangement diagram for illustrating the read and rewrite operations of the ferroelectric memory according to the first embodiment of the present invention.

In the period T1, the ferroelectric memory applies the voltage Vr to the selected word line WL while holding the voltage applied to the nonselected word lines WL at 0 V (ND), as shown in FIG. 9. Further, the ferroelectric memory brings all bit lines BL0 to BL3 into floating states. Thus, the ferroelectric memory applies the voltage Vr to the selected memory cells 1a, as shown in FIG. 10. A potential responsive to the data "0" stored in the corresponding selected memory cell 1a appears on the bit line BL0, while a potential responsive to the data "1" stored in the corresponding selected memory cell 1a appears on the bit line BL1. Further, a potential responsive to the data "2" stored in the corresponding selected memory cell 1a appears on the bit line BL2, while a potential responsive to the data "3" stored in the corresponding selected memory cell 1a appears on the bit line BL3. The ferroelectric memory applies the voltage 0 V to the nonselected memory cells 1a. Thereafter the ferroelectric memory applies the voltage 0 V to the selected word line WL and the nonselected word lines WL, as shown in FIG. 9. Thus, the ferroelectric memory applies the voltage 0 V to all memory cells 1a, as shown in FIG. 10.

Figure 11:
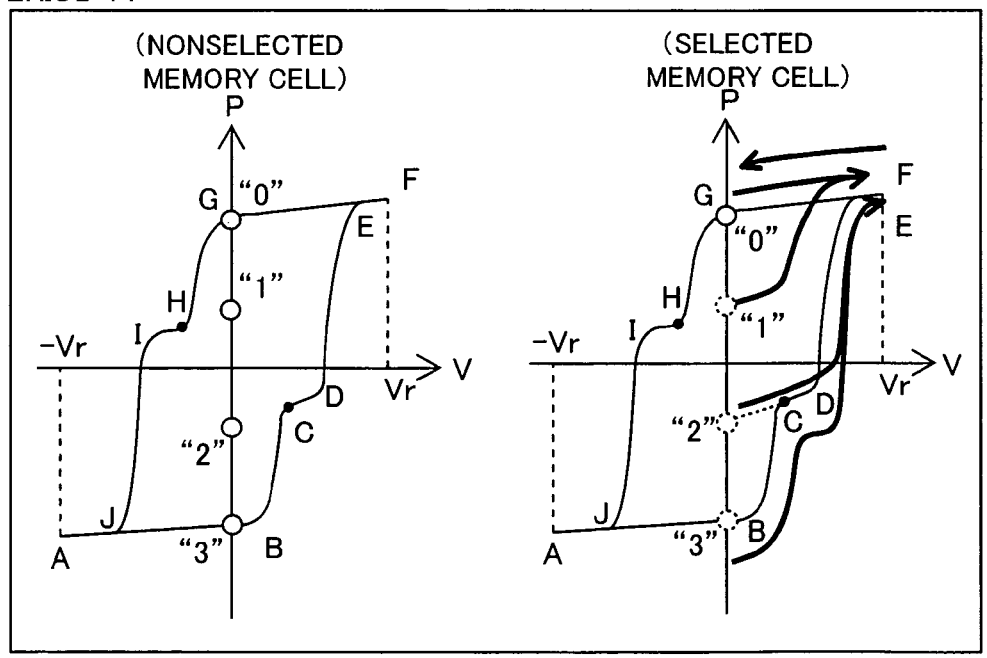
FIG. 11 is a hysteresis diagram for illustrating the read and rewrite operations of the ferroelectric memory according to the first embodiment of the present invention.

FIG. 11 shows the polarization states of the memory cells 1a in the period T1. In each nonselected memory cell 1a, the polarization state remains unchanging so that the data stored therein is not destroyed.

The polarization state of each selected memory cell 1a changes to the point F due to the applied voltage Vr, and thereafter changes to the point G due to the applied voltage 0 V. Therefore, the ferroelectric memory rewrites the data "0" in the selected memory cell 1a connected to the bit line BL0, not to destroy the data "0". On the other hand, the ferroelectric memory destroys the data "1", "2" and "3" stored in the selected memory cells 1a connected to the bit lines BL1 to BL3 respectively by rewriting the data "0" therein.

(Period T2: Rewrite Operation for Data "1")

In the period T2, the ferroelectric memory applies the voltage Va to the selected word line WL while applying a voltage Vm to the nonselected word lines WL upon termination of the period T1, as shown in FIG. 9. Further, the ferroelectric memory applies a voltage 2Vm to the bit line BL0 while applying the voltage 0 V to the bit lines BL1 to BL3. It is assumed that the aforementioned voltages Va and Vm satisfy the following expression (2):

$$0 < Vm < Va < Vr \qquad (29)$$

Figure 12:
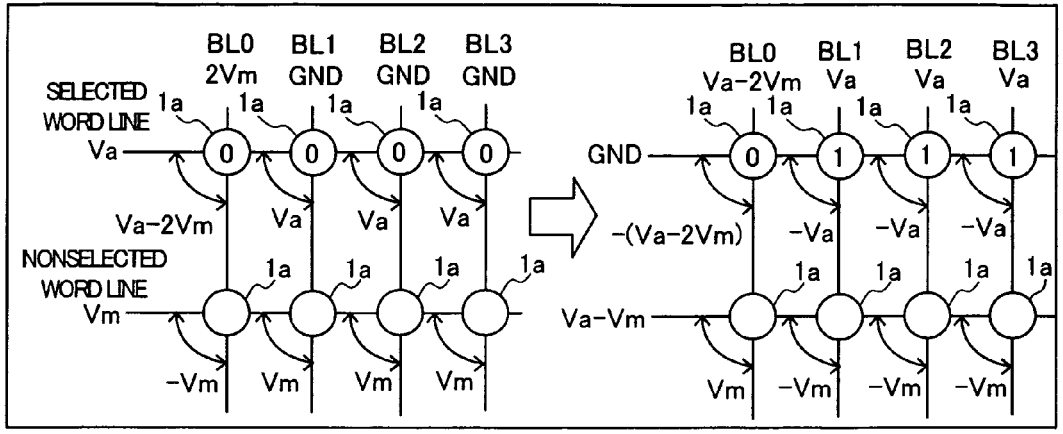
FIG. 12 is another voltage arrangement diagram for illustrating the read and rewrite operations of the ferroelectric memory according to the first embodiment of the present invention.

Thus, the ferroelectric memory applies a voltage Va−2Vm to the selected memory cell 1a connected to the bit line BL0 while applying the voltage Va to the selected memory cells 1a connected to the bit lines BL1 to BL3 respectively, as shown in FIG. 12. Further, the ferroelectric memory applies a voltage Vm−2Vm=−Vm to the nonselected memory cell 1a connected to the bit line BL0 while applying the voltage Vm to the nonselected memory cells 1a connected to the bit lines BL1 to BL3 respectively. Thereafter the ferroelectric memory applies the voltage 0 V to the selected word line WL, the nonselected word lines WL and all bit lines BL0 to BL3, as shown in FIG. 9.

Then, the ferroelectric memory applies the voltage 0 V to the selected word line WL while applying a voltage Va−Vm to the nonselected word lines WL. Further, the ferroelectric memory applies the voltage Va−2Vm to the bit line BL0, while applying the voltage Va to the bit lines BL1 to BL3. Thus, the ferroelectric memory applies a voltage −(Va−2Vm) to the selected memory cell 1a connected to the bit line BL0 while applying the voltage −Va to the selected memory cells 1a connected to the bit lines BL1 to BL3 respectively, as shown in FIG. 12. Further, the ferroelectric memory applies a voltage Va−Vm−(Va−2Vm)=Vm to the nonselected memory cell 1a connected to the bit line BL0, while applying a voltage Va−Vm−Va=−Vm to the nonselected memory cells 1a connected to the bit lines BL1 to BL3 respectively. Thereafter the ferroelectric memory applies the voltage 0 V to the selected word line WL, the nonselected word lines WL and all bit lines BL0 to BL3, as shown in FIG. 9.

Figure 13:
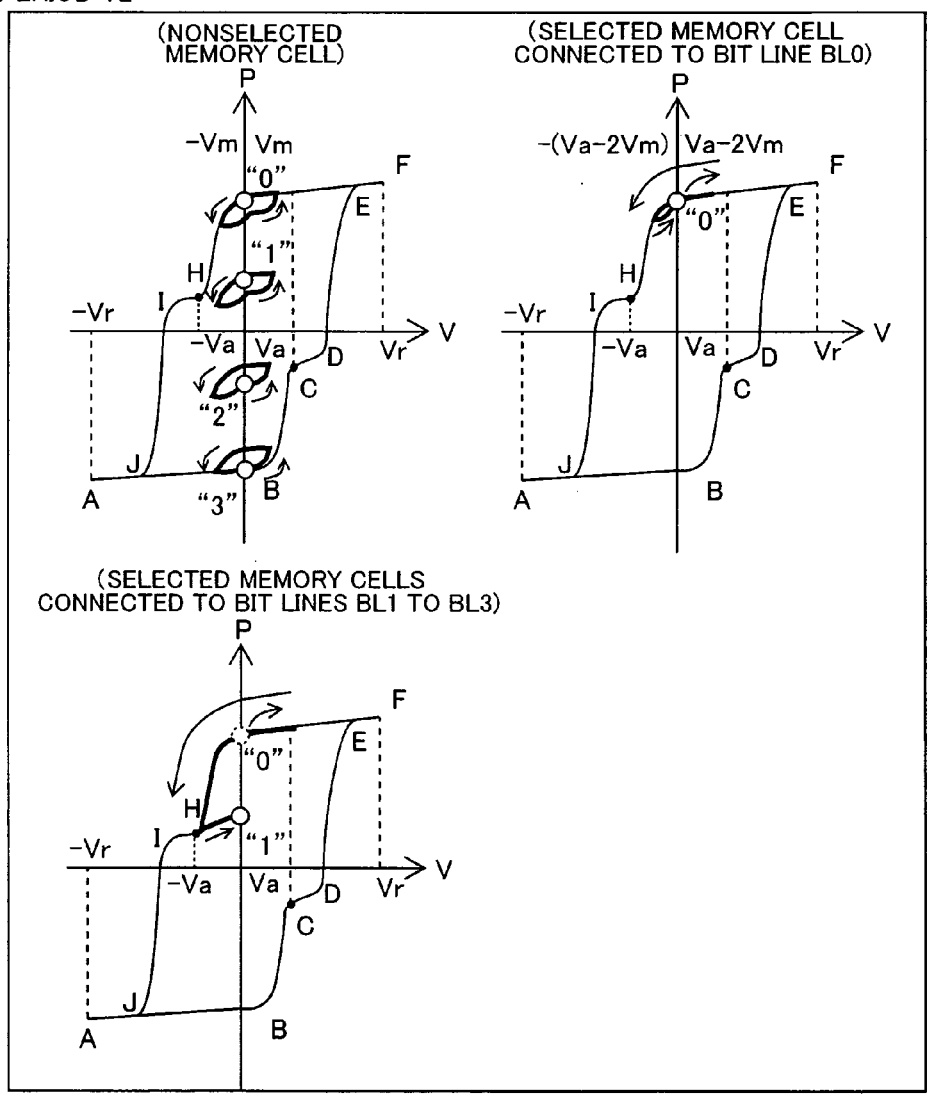
FIG. 13 is another hysteresis diagram for illustrating the read and rewrite operations of the ferroelectric memory according to the first embodiment of the present invention.

FIG. 13 shows the polarization states of the memory cells 1a in the period T2. In each nonselected memory cell 1a, the polarization state is deteriorated once and improved once due to the single applications of the voltage Vm smaller than Va and the voltage −Vm of the reversed polarity having the same absolute value as Va. Therefore, no disturbances are accumulated in the nonselected memory cell 1a, so that the polarization state thereof is not deteriorated.

In the selected memory cell 1a connected to the bit line BL0, the polarization state is deteriorated once and improved once due to the single applications of the voltage Va−2Vm smaller than Va and the voltage −(Va−2Vm) of the reversed polarity having the same absolute value as Va−2Vm. Therefore, no disturbances are accumulated in the selected memory cell 1a connected to the bit line BL0 either, so that the polarization state thereof is not deteriorated. In other words, the selected memory cell 1a connected to the bit line BL0 continuously holds the data "0".

The polarization state of each of the selected memory cells 1a connected to the bit lines BL1 to BL3 changes to the point F due to the applied voltage Va, and thereafter changes to the point H due to the applied voltage −Va. Thereafter the ferroelectric memory rewrites the data "1" in the selected memory cells 1a connected to the bit lines BL1 to BL3 respectively by applying the voltage 0 V.

(Period T3: Rewrite Operation for Data "3")

In the period T3, the ferroelectric memory applies the voltage Vr to the selected word line WL while applying the voltage 2Vm to the nonselected word lines WL upon termination of the period T2, as shown in FIG. 9. Further, the ferroelectric memory applies a voltage Va+Vm to the bit lines BL0 and BL3 while applying the voltage 0 V to the bit lines BL2 and BL3. Thus, the ferroelectric memory applies a voltage Vr−(Va+Vm) to the selected memory cells 1a connected to the bit lines BL0 and BL1 respectively, while applying the voltage Vr to the selected memory cells 1a connected to the bit lines BL2 and BL3 respectively. Further, the ferroelectric memory applies a voltage 2Vm−(Va+Vm)=−(Va−Vm) to the nonselected memory cells 1a connected to the bit lines BL0 and BL1 respectively, while applying the voltage 2Vm to the nonselected memory cells 1a connected to the bit lines BL2 and BL3 respectively. Thereafter the ferroelectric memory applies the voltage 0 V to the selected word line WL, the nonselected word lines WL and all bit lines BL0 to BL3, as shown in FIG. 9.

Figure 14:
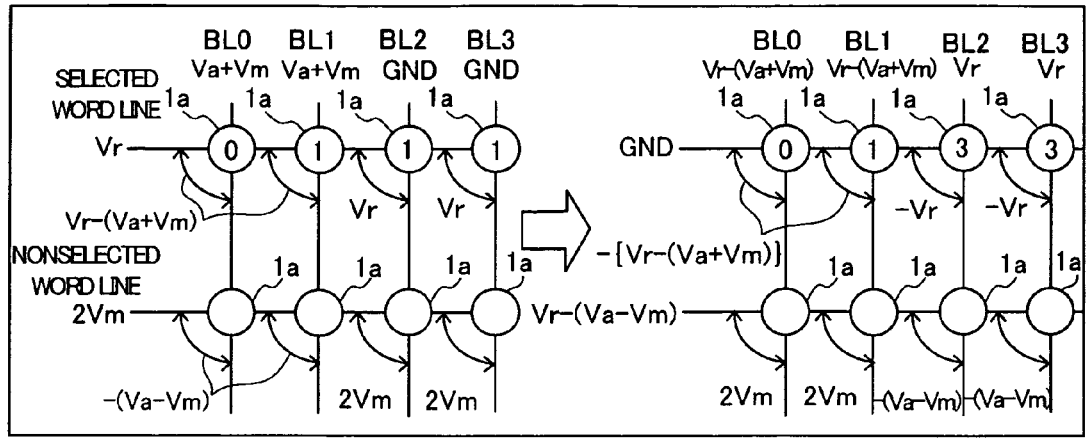
FIG. 14 is still another voltage arrangement diagram for illustrating the read and rewrite operations of the ferroelectric memory according to the first embodiment of the present invention.

Then, the ferroelectric memory applies the voltage 0 V to the selected word line WL, while applying a voltage Vr−(Va−Vm) to the nonselected word lines WL. Further, the ferroelectric memory applies a voltage Vr−(Va+Vm) to the bit lines BL0 and BL1, while applying the voltage Vr to the bit lines BL2 and BL3. Thus, the ferroelectric memory applies a voltage −{Vr−(Va+Vm)} to the selected memory cells 1a connected to the bit lines BL0 and BL1 respectively while applying the voltage −Vr to the selected memory cells 1a connected to the bit lines BL2 and BL3 respectively, as shown in FIG. 14. Further, the ferroelectric memory applies a voltage Vr−(Va−Vm)−{Vr−(Va+Vm)}=2Vm to the nonselected memory cells 1a connected to the bit lines BL0 and BL1 respectively, while applying a voltage Vr−(Va−Vm)−Vr=−(Va−Vm) to the nonselected memory cells 1a connected to the bit lines BL2 and BL3 respectively. Thereafter the ferroelectric memory applies the voltage 0 V to the selected word line WL, the nonselected word lines WL and all bit lines BL0 to BL3, as shown in FIG. 9.

Figure 15:
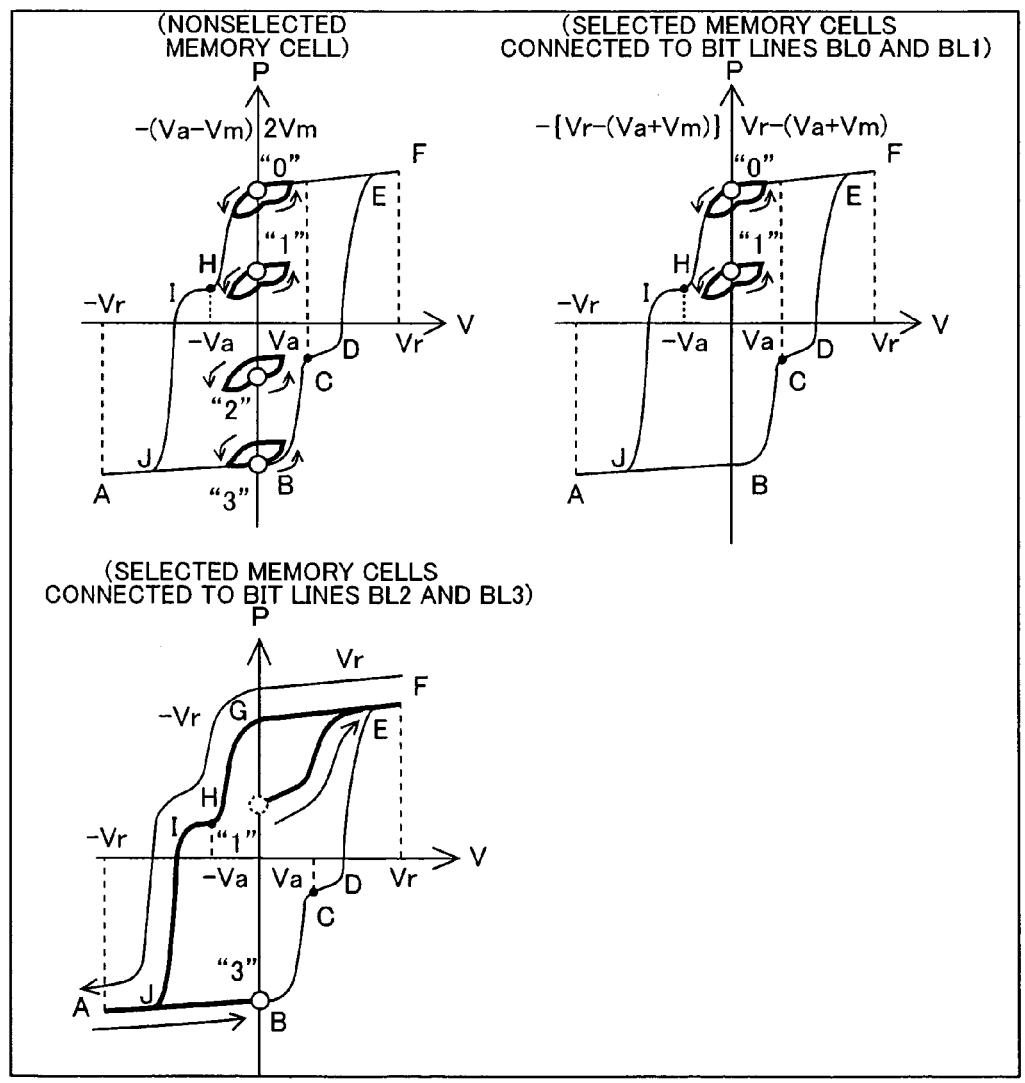
FIG. 15 is still another hysteresis diagram for illustrating the read and rewrite operations of the ferroelectric memory according to the first embodiment of the present invention.

FIG. 15 shows the polarization states of the memory cells 1a in the period T3. In other words, the ferroelectric memory applies the voltages −(Va−Vm) and 2Vm to each nonselected memory cell 1a once. In this case, the absolute values of −(Va−Vm) and 2Vm must be identical to each other, in order to cancel disturbances caused in the nonselected memory cell 1a. In other words, the voltages −(Va−Vm) and 2Vm satisfy the following expression (3):

$$2Vm = Va - Vm \tag{3}$$

According to the above expression (3), the voltages Vm and Va satisfy the following expression (4):

$$Vm = 1/3\, Va \tag{4}$$

Thus, the polarization state of each nonselected memory cell 1a is deteriorated once and improved once due to the single applications of the voltage 2/3Va smaller than Va and the voltage −2/3Va of the reversed polarity having the same absolute value as 2/3Va. Thus, no disturbances are accumulated in each nonselected memory cell 1a, so that the polarization state thereof is not deteriorated.

In each of the selected memory cells 1a connected to the bit lines BL0 and BL1, the polarization state is deteriorated once and improved once due to the single applications of the voltage Vr−(Va+Vm) and the voltage −{Vr−(Va+Vm)} of the reversed polarity having the same absolute value as Vr−(Va+Vm). In each of the selected memory cells 1a connected to the bit lines BL0 and BL1, therefore, no disturbances are accumulated either, so that the polarization state thereof is not deteriorated. In other words, the selected memory cells 1a connected to the bit lines BL0 and BL1 continuously hold the data "0" and "1" respectively.

If the voltage −{Vr−(Va+Vm)} applied to the selected memory cell 1a connected to the bit line BL0 is smaller than −Va, the polarization state of the selected memory cell 1a changes between the points H and I. If applying 0 V to the selected memory cell 1a connected to the bit line BL0 in this polarization state, the ferroelectric memory destroys the data "0" by rewriting the data "1" in the selected memory cell 1a connected to the bit line BL0. In order to prevent such destruction of the data "0" in the selected memory cell 1a connected to the bit line BL0, therefore, the voltage −{Vr−(Va+Vm)} must be larger than the voltage −Va. In other words, the voltages $-\{Vr-(Va+Vm)\}$ and $-Va$ satisfy the following expression (5):

$$-Va<-\{Vr-(Va+Vm)\}<0 \quad (5)$$

According to the above expressions (4) and (5), the voltage Vr and Va satisfy the following expression (6):

$$4/3Va<Vr<7/3Va \quad (6)$$

According to the first embodiment, the ratio Vr/Va of the voltage Vr to the voltage Va corresponds to the ratio d2/d1 of the larger thickness d2 of the ferroelectric film 11b to the smaller thickness d1 of the ferroelectric film 11a shown in FIG. 4.

The polarization state of each of the selected memory cells 1a connected to the bit lines BL2 and BL3 respectively changes to the point F due to the applied voltage Vr, and thereafter changes to the point A due to the applied voltage $-Vr$. Thereafter the ferroelectric memory applies the voltage 0 V to the selected memory cells 1a connected to the bit lines BL2 and BL3 respectively, thereby rewriting the data "3" therein.

(Period T4: Rewrite Operation for Data "2")

Figure 16:
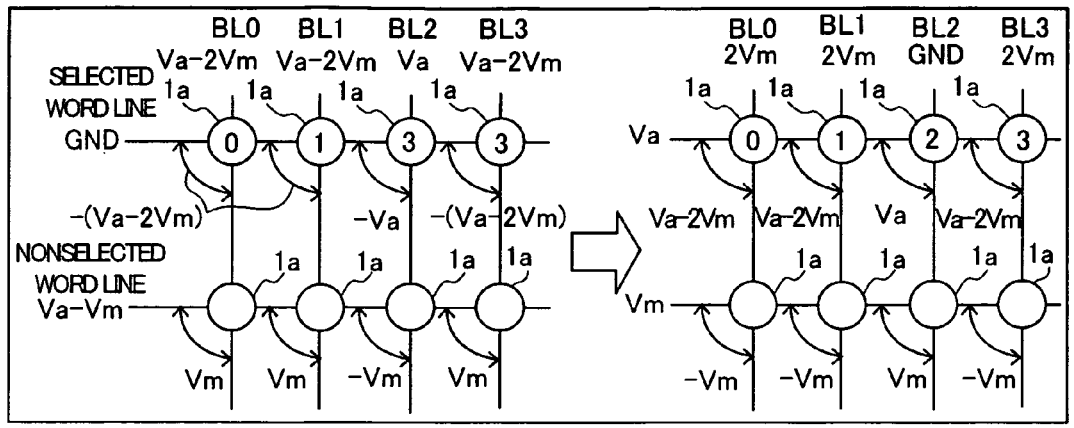
FIG. 16 is a further voltage arrangement diagram for illustrating the read and rewrite operations of the ferroelectric memory according to the first embodiment of the present invention.

In the period T4, the ferroelectric memory applies the voltage 0 V to the selected word line WL while applying the voltage Va–Vm to the nonselected word lines WL upon termination of the period T3, as shown in FIG. 9. Further, the ferroelectric memory applies the voltage Va–2Vm to the bit lines BL0, BL1 and BL3, while applying the voltage Va to the bit line BL2. Thus, the ferroelectric memory applies the voltage $-(Va-2Vm)$ to the selected memory cells 1a connected to the bit lines BL0, BL1 and BL3 respectively while applying the voltage $-Va$ to the selected memory cell 1a connected to the bit line BL2, as shown in FIG. 16. Further, the ferroelectric memory applies the voltage Va–Vm–(Va–2Vm)=Vm to the nonselected memory cells 1a connected to the bit lines BL0, BL1 and BL3 respectively, while applying the voltage Va–Vm–Va=–Vm to the nonselected memory cell 1a connected to the bit line BL2. Thereafter the ferroelectric memory applies the voltage 0 V to the selected word line WL, the nonselected word lines WL and all bit lines BL0 to BL3, as shown in FIG. 9.

Then, the ferroelectric memory applies the voltage Va to the selected word line WL, while applying the voltage Vm to the nonselected word lines WL. Further, the ferroelectric memory applies the voltage 2Vm to the bit lines BL0, BL1 and BL3, while applying 0 V to the bit line BL2. Thus, the ferroelectric memory applies the voltage Va–2Vm to the selected memory cells 1a connected to the bit lines BL0, BL1 and BL3 respectively while applying the voltage Va to the selected memory cell 1a connected to the bit line BL2, as shown in FIG. 16. Further, the ferroelectric memory applies the voltage Vm–2Vm=–Vm to the nonselected memory cells 1a connected to the bit lines BL0, BL1 and BL3 respectively, while applying the voltage Vm to the nonselected memory cell 1a connected to the bit line BL2. Thereafter the ferroelectric memory applies the voltage 0 V to the selected word line WL, the nonselected word lines WL and all bit lines BL0 to BL3, as shown in FIG. 9.

Figure 17:
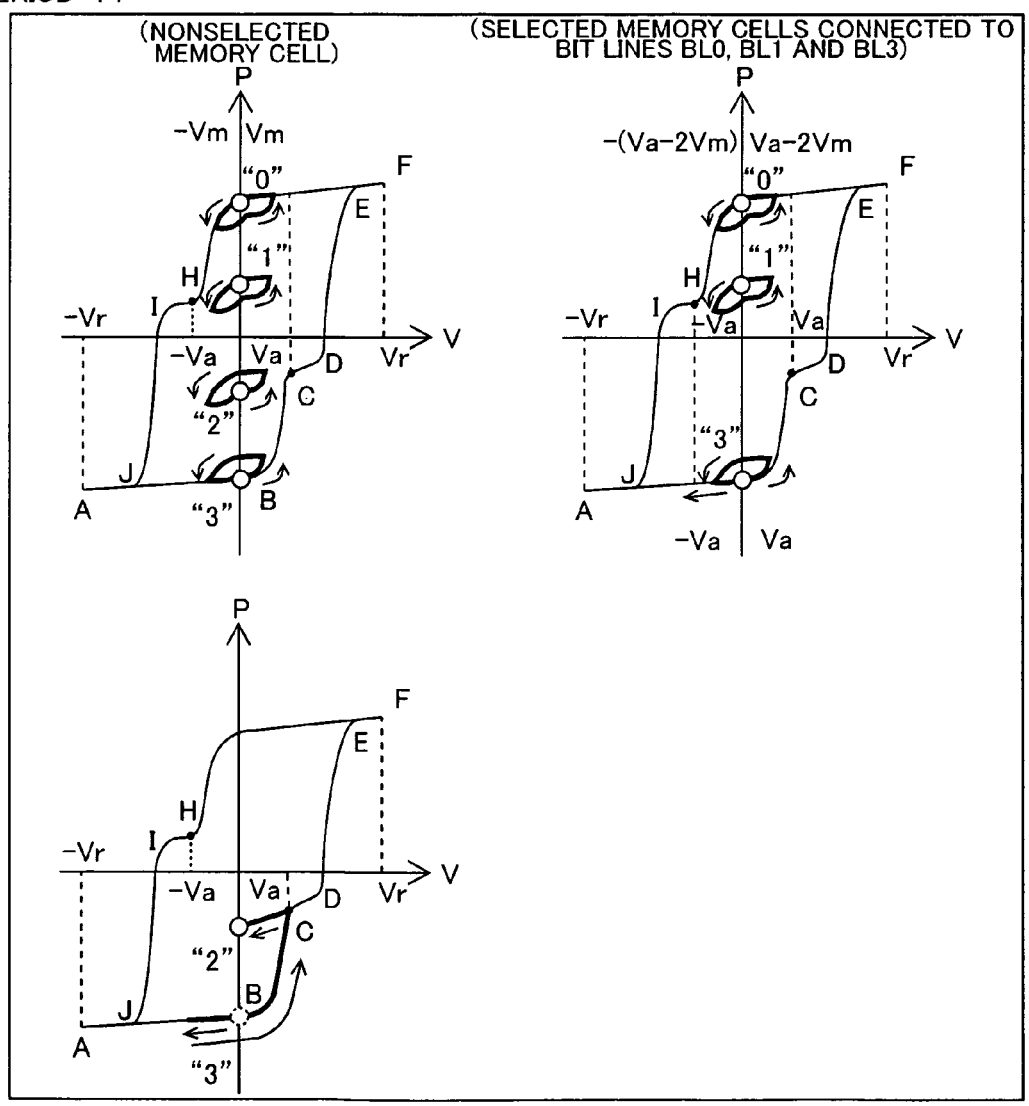
FIG. 17 is a further hysteresis diagram for illustrating the read and rewrite operations of the ferroelectric memory according to the first embodiment of the present invention.

FIG. 17 shows the polarization states of the memory cells 1a in the period T4. The polarization state of each nonselected memory cell 1a is deteriorated once and improved once due to the single applications of the voltage Vm smaller than Va and the voltage $-Vm$ of the reversed polarity having the same absolute value as Va. Therefore, no disturbances are accumulated in the nonselected memory cell 1a, so that the polarization state is not deteriorated.

In each of the selected memory cells 1a connected to the bit lines BL0, BL1 and BL3 respectively, the polarization state is deteriorated once and improved once due to the single applications of the voltage Va–2Vm smaller than Va and the voltage $-(Va-2Vm)$ of the reversed polarity having the same absolute value as Va–2Vm. Therefore, no disturbances are accumulated in each of the selected memory cells 1a connected to the bit lines BL0, BL1 and BL3 respectively either, so that the polarization state is not deteriorated. In other words, the selected memory cells 1a connected to the bit lines BL0, BL1 and BL3 continuously hold the data "0", "1" and "3" respectively.

The polarization state of the selected memory cell 1a connected to the bit line BL2 changes to the point A due to the applied voltage $-Va$, and thereafter changes to the point C due to the applied voltage Va. Thereafter the ferroelectric memory rewrites the data "2" in the selected memory cell 1a connected to the bit line BL2 by applying the voltage 0 V.

According to the first embodiment, the voltages Vm and Va satisfy the above expression (4), whereby the applied voltages shown in FIG. 9 have the values parenthesized in FIG. 9 respectively. In other words, the values of Vm and 2Vm are 1/3Va and 2/3Va respectively. The values of Va–Vm and Va–2Vm are 2/3Va and 1/3Va respectively. The value of Va+Vm is 4/3Va. Further, the values of Vr–(Va–Vm) and Vr–(Va+Vm) are Vr–2/3Va and Vr–4/3Va respectively.

The voltage generation circuit 10 shown in FIG. 1 generates the aforementioned eight types of applied voltages (0 V, Vr, Va, 1/3Va, 2/3Va, 4/3Va, Vr–2/3Va and Vr–4/3Vr). The ferroelectric memory applies the voltages generated in the voltage generation circuit 10 to the word lines WL0 to WL3 through the row decoder 2, while applying the voltages generated in the voltage generation circuit 10 to the bit lines BL0 to BL3 through the column decoder 3. Further, the ferroelectric memory controls the voltages applied to the word lines WL0 to WL3 on the basis of an address received through the row address buffer 4, while controlling the voltages applied to the bit lines BL0 to BL3 on the basis of another address received through the column address buffer 5. In reading, the read amplifier 8 reads data stored in the memory cells 1a while the output buffer 9 outputs the read data. On the other hand, the ferroelectric memory writes data in the memory cells 1a through the input buffer 7 and the write amplifier 6.

According to the first embodiment, as hereinabove described, the bit line BL0 (BL1 to BL3), the word line WL0-1 (WL1-1 to WL3-1) and the corresponding ferroelectric film 11a constitute the corresponding ferroelectric capacitor 12a while the bit line BL0 (BL1 to BL3), the word line WL0-2 (WL1-2 to WL3-2) and the corresponding ferroelectric film 11b constitute the corresponding ferroelectric capacitor 12b and these ferroelectric films 11a and 11b have capacitances different from each other, so that the ferroelectric capacitors 12a and 12b can have hystereses different from each other. Thus, the hysteresis of the memory cell 1a constituted of the ferroelectric capacitors 12a and 12b has the plurality of portions where the hysteretic inclination remarkably changes due to the composition of the hystereses of the ferroelectric capacitors 12a and 12b. Therefore, the multivalued ferroelectric memory can be obtained by constituting each memory cell 1a of the ferroelectric capacitors 12a and 12b having the capacitances different from each other. In this case, the word lines WL0-1 (WL1-1 to WL3-1) and WL0-2 (WL1-2 to WL3-2) are arranged to intersect with the bit line BL0 (BL1 to BL3) while holding the bit line BL0 (BL1 to BL3) therebetween and the ferroelectric films 11a and 11b having the capacitances different from each other are provided between the bit line BL0 (BL1 to BL3) and the word line WL0-1 (WL1-1 to WL3-1) and between the bit line BL0 (BL1 to BL3) and the word line WL0-2 (WL1-2 to WL3-2) respectively on the region where the bit line BL0 (BL1 to BL3 and the word line WL0 (WL1 to WL3) intersect with each other, so that the ferroelectric capacitors 12a and 12b having the hystereses different from each other are stacked with each other perpendicularly the surface of the bit line BL0 (BL1 to BL3) in the corresponding memory cell 1a. Thus, the plane area of each memory cell 1a can be reduced as compared with a memory cell constituted of ferroelectric capacitors, having hystereses different from each other, arranged in parallel with the surface of a corresponding bit line. Consequently, the multi-valued ferroelectric memory can be miniaturized.

According to the first embodiment, as hereinabove described, the ferroelectric films 11a and 11b of the ferroelectric capacitors 12a and 12b have the thicknesses different from each other, whereby the capacitances of the ferroelectric films 11a and 11b can be easily rendered different from each other. Thus, the hystereses of the ferroelectric capacitors 12a and 12b can be easily rendered different from each other.

According to the first embodiment, as hereinabove described, the ferroelectric films 11a and 11b are made of the same ferroelectric material while the thicknesses d1 and d2 thereof are so set that the ratio d2/d1 of the thickness d2 of the ferroelectric film 11b to the thickness d1 of the ferroelectric film 11a satisfies the above expression (1). When the voltages Va (d1) and Vr (d2) employed for driving the ferroelectric memory are made to correspond to the thicknesses d1 and d2 of the ferroelectric films 11a and 11b respectively to satisfy the above expression (1), therefore, the memory cells 1a can be prevented from deterioration of the polarization states in rewriting.

According to the first embodiment, as hereinabove described, the ferroelectric memory applies the voltage Vm and the voltage −Vm of the reversed polarity to the voltage Vm to the nonselected memory cells 1a by the same frequencies respectively in the periods T2 to T4 for the read and rewrite operations on the selected memory cells 1a so that the polarization states of the nonselected memory cells 1a are deteriorated and improved by the same frequencies throughout the read and rewrite operations, whereby the nonselected memory cells 1a can be prevented from deterioration of the polarization states.

SECOND EMBODIMENT

Figure 18:
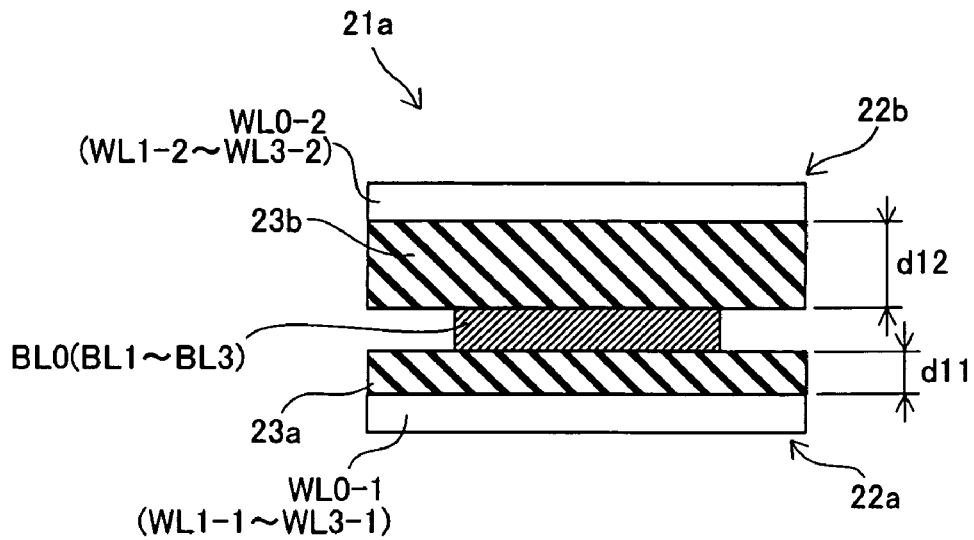
FIG. 18 is a sectional view showing the structure of each memory cell of a ferroelectric memory according to a second embodiment of the present invention.
Figure 19:
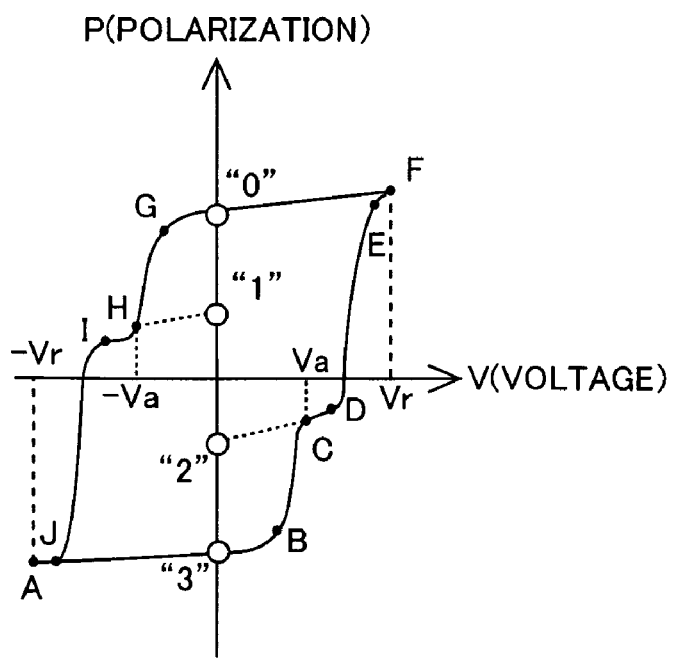
FIG. 19 is a hysteresis diagram of the memory cell of the ferroelectric memory according to the second embodiment shown in FIG. 18.

Referring to FIGS. 18 and 19, a ferroelectric memory according to a second embodiment of the present invention includes a bit line BL0 (BL1 to BL3) and word lines WL0-1 (WL1-1 to WL3-1) and WL0-2 (WL1-2 to WL3-2) arranged to intersect with the bit line BL0 (BL1 to BL3) while holding the bit line BL0 (BL1 to BL3) therebetween, similarly to the ferroelectric memory according to the aforementioned first embodiment. Further, two ferroelectric capacitors 22a and 22b arranged on a region where the bit line BL0 (BL1 to BL3) and a word line WL0 (WL1 to WL3) intersect with each other constitute a memory cell 21a.

The ferroelectric capacitors 22a and 22b include ferroelectric films 23a and 23b of PZT having a thickness of several 10 nm to several 100 nm respectively. The ferroelectric film 23a is arranged between the word line WL0-1 (WL1-1 to WL3-1) and the bit line BL0 (BL1 to BL3), while the ferroelectric film 23b is arranged between the word line WL0-2 (WL1-2 to WL3-2) and the bit line BL0 (BL1 to BL3). These ferroelectric films 23a and 23b have thicknesses different from each other. Assuming that d11 and d12 represent the thicknesses of the ferroelectric films 23a and 23b respectively, the ratio d12/d11 of the thickness d12 of the ferroelectric film 23b to the thickness d11 of the ferroelectric film 23a is set to satisfy the following expression similar to the above expression (1):

$$4/3 < d12/d11 < 7/3$$

The ferroelectric capacitors 22a and 22b are examples of the "first ferroelectric capacitor" and the "second ferroelectric capacitor" in the present invention respectively. The ferroelectric films 23a and 23b are examples of the "first ferroelectric film" and the "second ferroelectric film" in the present invention respectively.

According to the second embodiment, the ratio d12/d11 of the thickness d12 of the ferroelectric film 23b to the thickness d11 of the ferroelectric film 23a is set to about 2, dissimilarly to the aforementioned first embodiment. In other words, the memory cell 21a of the ferroelectric memory according to the second embodiment has a composite hysteresis (see FIG. 19) different from that of the memory cell 1a of the ferroelectric memory according to the aforementioned first embodiment. In the composite hysteresis of the memory cell 21a of the ferroelectric memory according to the second embodiment shown in FIG. 19, points A to J correspond to the points A to J in the composite hysteresis diagrams according to the aforementioned first embodiment shown in FIGS. 7 and 8 respectively. In the composite hysteresis of the memory cell 21a of the ferroelectric memory according to the second embodiment, voltages Va and −Va corresponding to the points C and H are set to 1/2Vr and −1/2Vr respectively.

The remaining structure of the ferroelectric memory according to the second embodiment is similar to that of the ferroelectric memory according to the aforementioned first embodiment.

Figure 20:
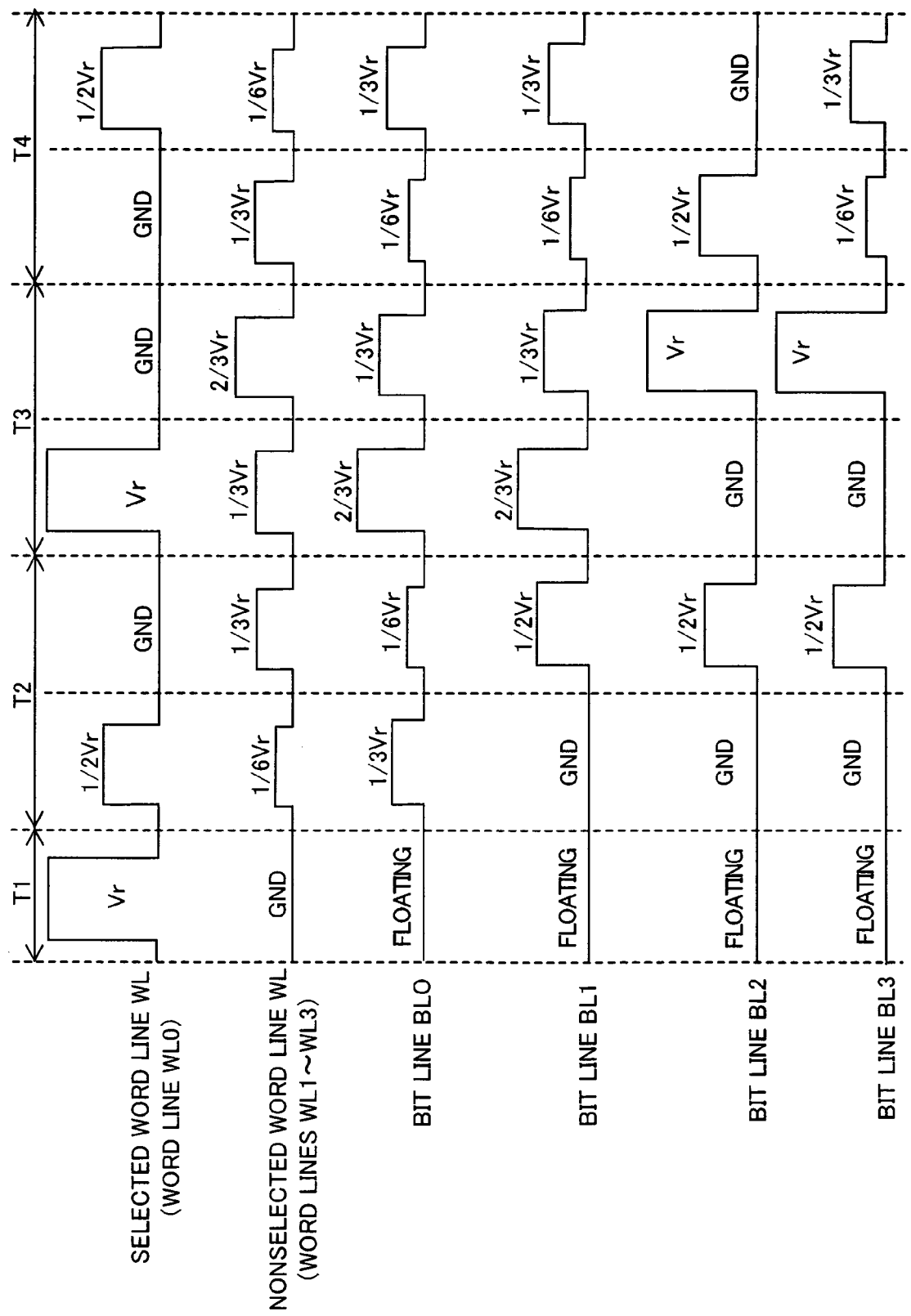
FIG. 20 is a voltage waveform diagram for illustrating read and rewrite operations of the ferroelectric memory according to the second embodiment of the present invention.

Referring to FIG. 20, the ferroelectric memory according to the second embodiment applies voltages, similar to those used in the read and rewrite operations of the ferroelectric memory according to the first embodiment shown in FIG. 9, in the following manner in read and rewrite operations due to the voltage Va set to 1/2Vr:

In the read and rewrite operations, the ferroelectric memory according to the second embodiment applies voltages 1/2Vr and 1/6Vr in place of the voltages Va and 1/3Va used in the read and rewrite operations of the ferroelectric memory according to the first embodiment. Further, the ferroelectric memory applies a voltage 1/3Vr in place of the voltages 2/3Va and Vr−4/3Va. In addition, the ferroelectric memory applies a voltage 2/3Vr in place of the voltages 4/3Va and Vr−2/3Va. Therefore, the ferroelectric memory according to the second embodiment uses six types of applied voltages (0 V, Vr, 1/2Vr, 1/3Vr, 2/3Vr and 1/6Vr) in the read and rewrite operations, dissimilarly to the ferroelectric memory according to the first embodiment.

According to the second embodiment, the read and rewrite operations of the ferroelectric memory are similar to those of the ferroelectric memory according to the aforementioned first embodiment except the applied voltages.

According to the second embodiment, as hereinabove described, the word lines WL0-1 (WL1-1 to WL3-1) and WL0-2 (WL1-2 to WL3-2) are so arranged as to intersect with the bit line BL0 (BL1 to BL3) while holding the bit line BL0 (BL1 to BL3) therebetween and the ferroelectric films 23a and 23b having the thicknesses different from each other are provided between the bit line BL0 (BL1 to BL3) and the word line WL0-1 (WL1-1 to WL3-1) and between the bit line BL0 (BL1 to BL3) and the word line WL0-2 (WL1-2 to WL3-2) respectively in the region where the bit line BL0 (BL1 to BL3)

and the word line WL0 (WL1 to WL3) intersect with each other so that the ferroelectric capacitors 22a and 22b having the hystereses different from each other are stacked with each other perpendicularly to the surface of the bit line BL0 (BL1 to BL3) in the corresponding memory cell 21a, whereby the plane area of each memory cell 21a can be reduced. Consequently, the multi-valued ferroelectric memory can be miniaturized similarly to the ferroelectric memory according to the aforementioned first embodiment.

According to the second embodiment, as hereinabove described, the ferroelectric films 23a and 23b are made of the same ferroelectric material while the thicknesses d11 and d12 thereof are so set that the ratio d12/d11 of the thickness d12 of the ferroelectric film 23b to the thickness d11 of the ferroelectric film 23a is about 2, whereby the ferroelectric memory according to the second embodiment can apply the voltage 1/2Vr in place of the voltage Va employed for driving the ferroelectric memory according to the first embodiment. Thus, the number of the types of the voltages used for the read and rewrite operations can be reduced to six (0 V, Vr, 1/2Vr, 1/3Vr, 2/3Vr and 1/6Vr) in the ferroelectric memory according to the second embodiment, whereby the structure of a voltage generation circuit (not shown) can be simplified.

The remaining effects of the ferroelectric memory according to the second embodiment are similar to those of the ferroelectric memory according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric films of PZT are employed in each of the aforementioned first and second embodiments, the present invention is not restricted to this but the ferroelectric films may alternatively be made of another ferroelectric material such as SBT ($SrBi_2Ta_2O_9$) or BLT ($(Bi, La)_4Ti_3O_{12}$).

While the two ferroelectric films included in each memory are made of the same ferroelectric material in each of the aforementioned first and second embodiments, the present invention is not restricted to this but the two ferroelectric films included in each memory cell may alternatively be made of ferroelectric materials different from each other. If the capacitances of the two ferroelectric films are different from each other in this case, the thicknesses of the two ferroelectric films may be equalized with each other.

What is claimed is:

1. A memory comprising:
   a bit line;
   a first word line and a second word line arranged to intersect with said bit line while holding said bit line therebetween; and
   a first ferroelectric film and a second ferroelectric film, having capacitances different from each other, arranged between said bit line and said first word line and between said bit line and said second word line respectively at least on a region where said bit line and said first and second word lines intersect with each other, wherein
   said bit line, said first word line and said first ferroelectric film constitute a first ferroelectric capacitor while said bit line, said second word line and said second ferroelectric film constitute a second ferroelectric capacitor, and
   said first ferroelectric capacitor and said second ferroelectric capacitor constitute a memory cell.

2. The memory according to claim 1, wherein
   said first ferroelectric film of said first ferroelectric capacitor and said second ferroelectric film of said second ferroelectric capacitor have thicknesses different from each other.

3. The memory according to claim 2, wherein
   said first ferroelectric film and said second ferroelectric film are made of the same ferroelectric material, and
   the ratio d2/d1 of the thickness d2 of said second ferroelectric film to the thickness d1 of said first ferroelectric film is so set as to satisfy the following expression (1):

$$4/3 < d2/d1 < 7/3 \tag{1}$$

4. The memory according to claim 3, further comprising a voltage generation circuit generating voltages applied to said memory cell in a read operation and a plurality of rewrite operations on said memory cell, wherein
   said voltage generation circuit applies eight types of voltages.

5. The memory according to claim 3, wherein
   the ratio d2/d1 of the thickness d2 of said second ferroelectric film to the thickness d1 of said first ferroelectric film is substantially 2.

6. The memory according to claim 5, further comprising a voltage generation circuit generating voltages applied to said memory cell in a read operation and a plurality of rewrite operations on said memory cell, wherein
   said voltage generation circuit applies six types of voltages.

7. The memory according to claim 1, applying a first voltage and a second voltage of reversed polarity to said first voltage to nonselected said memory cell by the same frequencies respectively in at least one rewrite operation among a read operation and a plurality of rewrite operations on selected said memory cell.

8. The memory according to claim 7, wherein
   said read operation and said plurality of rewrite operations on said selected memory cell include a single read and rewrite operation period and three rewrite operation periods,
   a polarization state of said nonselected memory cell remains unchanging in said single read and rewrite operation period, and
   the memory applies said first voltage and said second voltage of reversed polarity to said first voltage to said nonselected memory cell by the same frequencies respectively in said three rewrite operation periods.

9. The memory according to claim 1, wherein
   said first ferroelectric capacitor and said second ferroelectric capacitor are connected in parallel with each other.

10. The memory according to claim 1, wherein
    said first ferroelectric capacitor and said second ferroelectric capacitor have hystereses different from each other.

11. The memory according to claim 10, wherein
    said memory cell has a composite hysteresis obtained by compositing said hystereses of said first ferroelectric capacitor and said second ferroelectric capacitor with each other.

12. The memory according to claim 11, wherein
    said composite hysteresis has a portion where hysteretic inclination remarkably changes.

13. The memory according to claim 12, wherein
    said hysteretic inclination remarkably changes on two portions.

14. The memory according to claim 13, wherein
    said memory cell has four polarization states when a voltage applied to said memory cell is 0 V.

15. The memory according to claim 14, wherein one said memory cell is capable of storing four data.
16. The memory according to claim 1, wherein
said first word line is arranged under said bit line through said first ferroelectric film, and
said second word line is arranged on said bit line through said second ferroelectric film.
17. The memory according to claim 1, wherein
said first ferroelectric film and said second ferroelectric film are so formed as to extend in the same directions as said first word line and said second word line respectively.

* * * * *